(12) United States Patent
Jourdan et al.

(10) Patent No.: US 12,160,199 B2
(45) Date of Patent: Dec. 3, 2024

(54) ELECTROMECHANICAL CONVERSION DEVICE AND SYSTEM USING SUCH A DEVICE

(71) Applicants: COMMISSARIAT À L'ENERGIE ATOMIQUE ET AUX ENERGIES ALTERNATIVES, Paris (FR); CENTRE NATIONAL DE LA RECHERCHE SCIENTIFIQUE, Paris (FR)

(72) Inventors: Guillaume Jourdan, Grenoble (FR); Sébastien Hentz, Grenoble (FR); Carine Ladner, Grenoble (FR); Kazi Rafsanjani Amin, Grenoble (FR); Julien Renard, Seyssinet-Pariset (FR); Nicolas Roch, Grenoble (FR)

(73) Assignees: COMMISSARIAT À L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 304 days.

(21) Appl. No.: 17/724,134

(22) Filed: Apr. 19, 2022

(65) Prior Publication Data
US 2022/0345087 A1    Oct. 27, 2022

(30) Foreign Application Priority Data
Apr. 20, 2021   (FR) ...................................... 2104084

(51) Int. Cl.
*H03H 3/007*       (2006.01)
*G06N 10/00*       (2022.01)
(Continued)

(52) U.S. Cl.
CPC ........... *H03B 15/003* (2013.01); *G06N 10/00* (2019.01); *H03H 3/007* (2013.01); *H03H 9/24* (2013.01)

(58) Field of Classification Search
CPC ........ H03H 3/007; H03H 9/24; H03B 15/003; G06N 10/00
(Continued)

(56) References Cited

U.S. PATENT DOCUMENTS 9,454,061 B1    9/2016  Abdo et al.
10,782,590 B2*  9/2020  Witmer ................... G02F 1/017

OTHER PUBLICATIONS

Search Report as issued in French Patent Application No. 2104084, dated Dec. 13, 2021.
(Continued)

*Primary Examiner* — Hai L Nguyen
(74) *Attorney, Agent, or Firm* — Pillsbury Winthrop Shaw Pittman LLP

(57) ABSTRACT

An electromechanical conversion device includes a resonant electrical circuit comprising an inductance and a capacitor, the capacitor including at least a first electrode and a second electrode; and a mechanical oscillator including at least one microbeam formed in a membrane, the first and second electrodes being located side by side and the first electrode of the capacitor being located on a face of the microbeam so that the electrical capacitance of the capacitor varies when the mechanical oscillator oscillates; device wherein the inductance includes an electric track of very low thickness made on the membrane and made of a superconductive material chosen so as to obtain an electric track with a high kinetic inductance.

15 Claims, 11 Drawing Sheets

(51) Int. Cl.
  *H03B 15/00* (2006.01)
  *H03H 9/24* (2006.01)
(58) Field of Classification Search
  USPC .......................................................... 333/99 S
  See application file for complete search history.

(56) References Cited

OTHER PUBLICATIONS

Arnold, G., et al., "Converting microwave and telecom photons with a silicon photonic nanomechanical interface," Nature Communications, vol. 11, Jan. 2020, XP002804874, 7 pages.
Kalaee, M., et al., "Quantum electromechanics of a hypersonic crystal," arxiv.org, Cornell University Library, Aug. 2018, XP081179905, DOI: 10.1038/S41565-019-0377-2, 18 pages.
Lambert, N. J., et al., "Coherent conversion between microwave and optical photons—an overview of physical implementations," arxiv.org, Cornell University Library, Jun. 2019, XP081383855, 17 pages.
Rodrigues, I. C., et al., "Coupling microwave photons to a mechanical resonator using quantum interference," arxiv.org, Cornell University Library, Jul. 2019, XP081388678, 26 pages.
Fink, J. M., et al., "Efficient microwave frequency conversion mediated by the vibrational motion of a silicon nitride nanobeam oscillator," arxiv.org, Cornell University Library, Nov. 2019, XP081541249, 9 pages.
Dieterle, P. B., et al., "Superconducting Cavity Electromechanics on a Silicon-on-Insulator Platform," American Physical Society, Physical Review Applied 6, 014013, (2016), 9 pages.
Peruzzo, M., et al., "Surpassing the resistance quantum with a geometric superinductor," Institute of Science and Technology Austria, Jul. 2020, 8 pages.

\* cited by examiner

Si

TiN

TiN   SiO$_2$

TiN   SiO$_2$   Si

ELECTROMECHANICAL CONVERSION DEVICE AND SYSTEM USING SUCH A DEVICE

CROSS-REFERENCE TO RELATED APPLICATIONS

This application claims priority to French Patent Application No. 2104084, filed Apr. 20, 2021, the entire content of which is incorporated herein by reference in its entirety.

FIELD

The technical field is that of quantum devices.

The present invention relates to an electromechanical conversion device and in particular an electromechanical conversion device comprising a resonant electrical circuit comprising an inductance as well as a capacitor, the capacitor having at least a first electrode and a second electrode one of which being located on a face of a microbeam, in such a way that the electrical capacitance of the capacitor varies when the microbeam oscillates.

BACKGROUND

In the framework of quantum computing, it may be necessary to address, coherently, different physical systems (this is generally referred to as hybrid systems) over a wide range of frequencies (for example, from the microwave range to that of optical or infrared photons). A means of carrying out such addressing is to use mechanical resonators in the quantum regime. Such resonators can for example be coupled with a qubit to ensure the addressing thereof, coherently convert infrared photons into microwaves or store the state of a photon. This is of course a non-exhaustive list.

The conversion of infrared photons into microwave photons (and vice-versa) has a very particular interest. Indeed, concerning quantum computing systems, many current achievements (for example based on superconducting Q-bits) implement phenomena and mechanisms of which the typical frequencies order of magnitude is about one Gigahertz. While for long-distance exchanges, an optical communication (via optical fibres for example) is one of the most adapted solutions. Being able to interface a system operating in the Gigahertz range with an optical communication network would therefore be particularly interesting. For this, a system is known comprising a mechanical resonator coupled on the one hand to a microwave resonator and on the other hand to an optical resonator. Such a system can in particular be implemented for distributed quantum computing, communications secured by quantum protocols or quantum metrology. It makes it possible in particular to respond to a noticeable technological need: how to transfer quantum information over long distances at room temperature.

A diagram of such a system is shown in FIG. 1. The system comprises a resonant circuit CR comprising an inductance L and a capacitor C of which one of the electrodes is able to vibrate. The capacitor is also connected via the inductance to a first quantum device operating in the GHz range (in this example, at about 7 GHz). Thus, the state of this first quantum device is coupled to the vibrations of the electrode of the capacitor C. The system also comprises an optical cavity CO wherein is placed a membrane MB able to vibrate. The vibration of this membrane MB is coupled, using a laser and the optical cavity CO, to a second quantum device operating in the hundred of THz range (in this example, around 192 THz). Thus, the state of this second quantum device is coupled to the vibrations of the membrane MB. Furthermore, the membrane MB is mechanically coupled to the electrode of the capacitor C able to vibrate. In some conditions of which the details shall be provided now, it is possible using this system to couple the first quantum device to the second quantum device.

The general principle of such a conversion is shown in FIG. 2. On the left is the portion of the system operating in the GHz range at the frequency $\omega_{\mu w}$. On the right is the portion of the system operating in the THz hundred range, at the frequency $\omega_{opt}$. So as to be able to couple these two portions, it is possible to inject into the first portion of the system a first pump signal at the frequency $\omega_{p1}$ and into the second portion of the system a second pump signal at the frequency $\omega_{p2}$. These two frequencies cannot however be chosen arbitrarily, but in such a way as to satisfy the following relationship:

$$\omega_{\mu w} - \omega_{p1} = \omega_{opt} - \omega_{p2} = \psi_m \quad \text{[Math. 1]}$$

When such a relation is satisfied, then it is possible to coherently create a photon at the frequency $\omega_{opt}$ from a photon at the frequency $\omega_{\mu w}$, with the mediation carried out through a phonon at the frequency $\omega_m$, and therefore transferring the quantum information from the first device to the second device.

So as to carry out such a conversation with a device that can be integrated, more compact than the one of FIG. 1, it has been proposed to use a circuit such as described in the document "Converting microwave and telecom photons with a silicon photonic nanomechanical interface" by G. Arnold et al., Nature Com. 11, Article number 4460 (2020) and shown in FIG. 3 (which corresponds to FIG. 1 of the document in question). In this document, so as to be able to obtain a microwave resonant circuit CR that has a resonant frequency in the GHz range, as the capacitance of the capacitor is low (in the femtofarad range), a rather high inductance, of about a hundred nanohenry or more, is desirable. In order to obtain an inductance that is high enough, the authors of this document propose to implement this inductance using an electric track wound around itself (to form a spiral coil), clearly visible in FIG. 3. Although such a structure allows for a conversion such as described hereinabove, the efficiency obtained is not high.

Indeed, generally, all the photons are not converted from one frequency range to the other. It is possible to define a conversion efficiency noted as $\eta_c$ which characterises the conversation ratio. It is possible to show that this efficiency is proportional to four quantities: the optical coupling factor of the optical cavity noted as $g_{opt}^2$, the number of photons of the optical pump noted as $n_{opt}$, the electromagnetic coupling function noted as $g_{em}^2$, and the number of photons of the microwave pump noted as $n_{MW}$. In what follows, the invention aiming to improve the electromechanical conversation, it is in the electromagnetic coupling function that we shall take interest. The latter is given by the following equation:

$$g_{em} = \eta \frac{\omega_{\mu w}}{2} \frac{1}{C_g} \frac{\partial C_g}{\partial a} \text{ with } \eta = \frac{C_g}{C_{tot}} \quad \text{[Math 2]}$$

Where $\omega_{\mu w}$ is the resonant frequency of the microwave circuit, $C_g$ is the capacitance of the variable (mobile) capacitor, coupled to the mechanical resonator, and of which at least one of the electrodes vibrates, $C_{tot}$ is the total capacitance of the microwave circuit (sum of the capacitance $C_g$ and of the parasite capacities that do not vary when the mechanical resonator vibrates), and a is the distance that separates the two electrodes (i.e.: the two conductors) of the capacitor C. As this expression shows, in order to maximise this coupling, it is important to ensure that the capacitance $C_g$ of the variable capacitor, coupled to the mechanical resonator, is close to the total capacitance $C_{tot}$. In other words, it is suitable to reduce as much as possible the parasite capacitances (not coupled to the mechanical vibration), in the resonant circuit.

However, in the circuit of FIG. 3, a non-negligible portion of the total capacitance $C_{tot}$ of the resonant circuit is not due to the capacitor C but is due instead to the parasitic capacitance corresponding to the windings of the inductance L. In addition, the geometry proposed is based on a method of manufacturing that requires several levels of metal and bridges which, although it is compatible with conventional micro-manufacturing techniques, presents nevertheless a certain difficulty.

The present invention proposes to respond to the limits of the systems of the prior art, introduced briefly hereinabove in terms of ease of manufacturing as well as in terms of electromagnetic coupling.

SUMMARY

An aspect of the invention offers a solution to the problems mentioned hereinabove, by proposing to carry out an inductance comprising an electric track of which the material and the geometry are chosen in such a way as to obtain a high kinetic inductance.

A first aspect of the invention relates to an electromechanical conversion device comprising:
- a resonant electrical circuit comprising an inductance as well as a capacitor, the capacitor having at least a first electrode and a second electrode; and
- a mechanical oscillator comprising at least one microbeam formed in a membrane, the first and second electrodes being located side by side and the first electrode of the capacitor being located on a face of the microbeam in such a way that the electrical capacitance of the capacitor varies when the mechanical oscillator oscillates;

device wherein the inductance comprises an electric track of very low thickness made on the membrane (the track extends over the surface of the membrane) and mode of a superconductive material chosen in such a way as to obtain an electric track having a high kinetic inductance, three times greater than its magnetic inductance.

Thanks to the invention, it is no longer necessary to carry out windings to obtain the required inductance. The latter is indeed obtained by the use of an electric track of which the material and the thickness were chosen in such a way as to obtain a high kinetic inductance, that is added to the usual magnetic inductance. A high inductance can thus be obtained even in the absence of winding and even if the total length of the track remains moderate, which makes it possible to obtain the desired value of inductance while still clearly reducing the parasitic capacitances, thus increasing the electromagnetic coupling factor $g_{em}^2$. Desirably, high kinetic inductance means a kinetic inductance per square greater than or equal to 20 picohenry per square, or even greater than or equal to 50 picohenry (pH) per square. Kinetic inductance per square means the kinetic inductance of a track segment of square shape (seen from above). Thus, as an example, a portion of track of which the length is equal to 100 times its width will have a kinetic inductance equal to (or at the very least close to) 100 times its kinetic inductance per square. For the purposes of information, for a track having a width comprised between 50 and 500 nanometres, the kinetic inductance of the track in question, per unit of length, can be greater than 0.1 nH/µm, even greater than 0.3 nH/µm or even greater than 1 nH/µm.

In addition to the features that have just been mentioned in the preceding paragraph, the device according to a first aspect of the invention can have one or more additional characteristics among the following, taken individually or in any technically permissible combination.

In an embodiment, the electric track has a kinetic inductance per square greater than or equal to 20 picohenry per square, or even greater than or equal to 50 pH per square.

In an embodiment, the superconductive material of the electric track is chosen from titanium nitride (TiN), niobium nitride (NbN) or a granular superconductive material. Granular superconductive material means for example a material formed from grains made from superconductive material, each having a typical dimension (for example a diameter) less than 10 nm. The grains in question can in particular be separated from each other by thin layers of an insulating oxide (for example AlOx if the material is granular Aluminium). Titanium nitride is particularly beneficial because it makes it possible to obtain very thin layers, which, in addition to guaranteeing a high kinetic inductance, makes it possible to provide the oscillator with good mechanical properties, the mass added by the electrode to the microbeam being reduced to the strict minimum.

In an embodiment, the thickness of the electric track is less than or equal to 20 nm, even less than or equal to 10 nm or even 5 nm. Once again, this reduces the mass of the electric track on the microbeam while still increasing the kinetic inductance of the electric tracks, with all the benefits described hereinabove.

In an embodiment, the thickness of the electric track is less than or equal to the London's length of the superconductive material.

In an embodiment, over most of its length, even over its entire length, the electric track does not comprise portions extending facing one another while being separated from one another by a distance less than 5 times, even 10 times the width of the electric track, except for the portions that form the electrodes of the mobile electrode capacitor. Such a constraint makes it possible to limit the parasitic capacitances at the inductance.

In an embodiment, the microbeam of the mechanical oscillator is referred to as first microbeam and the mechanical oscillator comprises a second microbeam and a third microbeam, the first and the second microbeams being connected to one another in such a way as to form a diapason, the third microbeam being located between the two microbeams of the diapason, the second electrode of the capacitor being formed on the third microbeam. This configuration has the benefit of obtaining a balanced resonant mode: the factor of quality is higher than a configuration with a single microbeam because the coupling with the external vibration modes is smaller. Diapason means a mechanical structure with two branches (with two beams) able to vibrate in a balanced way, i.e. without displacement of the centre of mass of the whole (or at the very least with a minimal displacement of this centre of mass). This can be obtained with two beams that are symmetrical with one another from a geometrical standpoint. The two beams of the diapason can also be slightly dissymmetric with one another, but however have the same mass, or vibrate with different respective amplitudes, but such that the centre of masse remains immobile.

Note that the term electrode generally designates an element made of a conductive material (and here, an element etched in a thin layer of this conductive material).

In an embodiment, at least a portion of the electric track is formed on a substrate of the "trap-rich" type. This can be a "SOI" substrate made from "Silicon On Insulator", wherein the top silicon layer ("Si top"), and the layer of insulator (in silicon oxide) that supports it were suitably etched. Alternatively, the device could comprise a polycrystalline top silicon layer ("Si top") obtained via deposition.

In an embodiment, at least a portion of the electric track is located on a portion of the membrane that is suspended (the layer of insulator of the SOI substrate having been removed, underneath this portion). This reduces the electrical losses in the resonant electrical circuit.

In an embodiment, the mechanical oscillator comprises a frame separated from a main portion of the membrane by openings made in the membrane, the microbeam being connected to the frame and the second electrode being carried out on the frame or on another microbeam that is connected to the frame, the frame being connected to the main portion of the membrane by a bridge and by one or more connector microbeams, each connector microbeam comprising two portions each longer than wide and which are connected to one another by making a bend.

In an embodiment, the mechanical oscillator is surrounded by acoustic insulators formed in the membrane, each insulator comprising several microbeams parallel to one another, with the direction of the microbeams varying from one insulator to the other.

A second aspect of the invention relates to a method for manufacturing an electromechanical conversion device such as the presented above, the method comprising, from a substrate comprising a silicon oxide layer and a silicon layer on the silicon oxide layer

- a step of full-plate deposition of a layer of superconductive material intended to form the electric track; then
- a first step of lithography in such a way as to obtain a pattern defining the membrane in the silicon layer, the pattern defining, inter alia, the at least one microbeam of the mechanical oscillator;
- a first step of etching the layer of superconductive material and of the layer of silicon according to the pattern defined during the first step of lithography; then
- a second step of lithography in such a way as to obtain a pattern defining the electric track;
- a second step of etching the layer of superconductive material according to the pattern defined during the second step of lithography in such a way as to obtain the electric track;
- a third step of etching in the silicon oxide layer in such a way as to release the silicon membrane defined hereinabove.

A third aspect of the invention relates to a quantum system comprising a conversion device according to the first aspect of the invention and an optical resonator, the optical resonator being coupled (by opto-mechanical coupling) to the mechanical oscillator of the conversion device.

A fourth aspect of the invention relates to a quantum system comprising a conversion device according to the first aspect of the invention and a qubit, the qubit being coupled to the conversion device.

The invention and its different applications shall be better understood when reading the following description and when examining the accompany figures.

BRIEF DESCRIPTION OF THE FIGURES

The figures are shown for the purposes of information and in no way limit the invention.

DETAILED DESCRIPTION

The figures are presented for the purposes of information and in no way limit the invention.

Unless mentioned otherwise, the same element that appears in different figures has a unique reference.

Electromechanical Conversion Device

Figure 4:
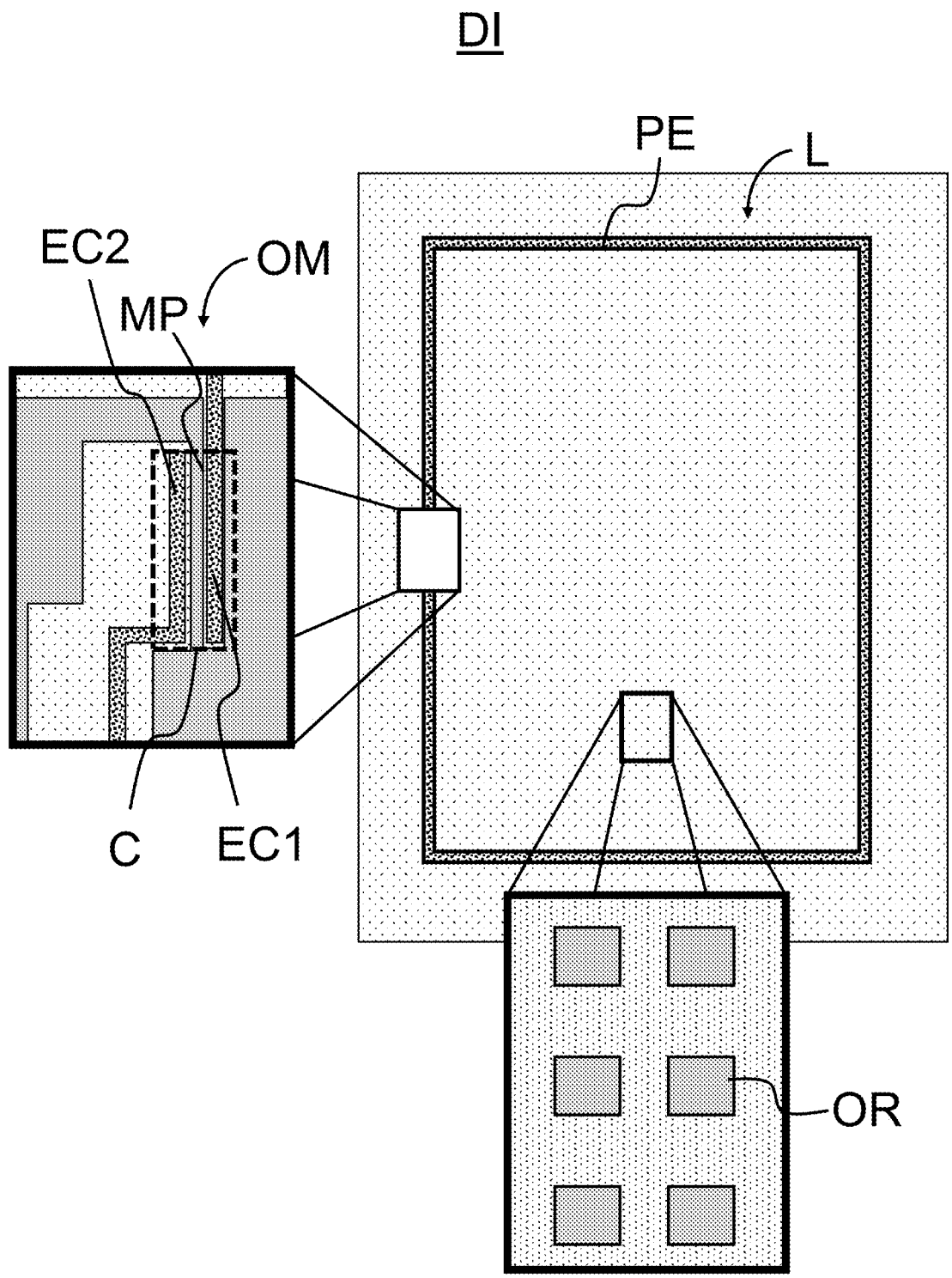
FIG. 4 shows a schematic representation of a device according to the invention, seen from above.

An aspect of the invention relates to an electromechanical conversion device DI. As shown in FIG. 4, the device DI according to an aspect of the invention comprises a resonant electrical circuit comprising an inductance L as well as a capacitor C having at least a first electrode EC1 and a second electrode EC2. It also comprises a mechanical oscillator OM comprising at least one microbeam MP formed in a membrane (the membrane being represented by the zone with thin dots which, in the example of FIG. 4, covers most of the surface of the device DI). As explained hereinbelow, the microbeam is obtained by etching the membrane (it is so to speak cut in the membrane). The microbeam is thus formed by a (small) portion of the membrane, that connects to the rest of the membrane by one of its two ends, or by its two ends, and with, on either side of the microbeam, openings or slots that delimit the microbeam, made in the membrane. At the microbeam, and more generally at the mechanical oscillator (and even over most of the surface of the device, here), this membrane is suspended. The first and second electrodes EC1, EC2 are located side by side and one of the electrodes EC1 of the capacitor C is located on a face, here a top face of the microbeam MP in such a way that the electrical capacitance of the capacitor C varies when the mechanical oscillator OM (and therefore the microbeam MP) oscillates. The first and second electrodes each include a track portion carried out flat on the membrane, these two track portions extending parallel to one another, at a short distance from one another. One of the edges of the first electrode EC1 extends facing one of the edges of the second electrodes EC2, parallel to the latter, and at a short distance from it. These two edges (and more generally the two electrodes EC1 and EC2) separate and come closer together when the microbeam oscillates, oscillation which occurs mainly in the plane of the membrane (displacement/deformation parallel to the membrane, to obtain a strong electromechanical coupling).

In addition, in the device DI according to an aspect of the invention the inductance L comprises an electric track PE of very low thickness carried out on the membrane in a superconductive material chosen in such a way as to obtain an electric track PE with a high kinetic inductance.

In an embodiment, high kinetic inductance means a kinetic inductance per square greater than or equal to 20 pH per square, or even greater than or equal to 50 pH per square. For the purposes of illustration, for a track having a width comprised between 50 and 500 nm, the kinetic inductance can be greater than 0.1 nH/µm, even 0.3 nH/µm or even greater than or equal to 1 nH/µm. The kinetic inductance can for example be defined as the total inductance of the electric track PE (or of the portion of electric track considered) less the magnetic inductance of the electric track PE. Magnetic inductance means the inductance due to the creation of a magnetic field by the track (at the exterior of the track) when an electric current passes through. The value of the kinetic inductance can therefore be determined by a measurement of the total inductance and a calculation (for example by finite elements) of the magnetic inductance (i.e.: of the "conventional", usual inductance), the latter being entirely determined by the geometry of the electric track PE. It can also be determined by comparing the inductance of the measured track at a temperature higher, then at a temperature lower than a critical temperature of the superconductive material forming the track (critical temperature beyond which the material is no longer superconductive).

Geometry of the Inductance

In an embodiment, shown in FIG. 4, the inductance is formed by an electric track PE following a path in the shape of a square or rectangle, on the surface of the membrane (in this figure, as well as in the following figures, this track is represented by the zone in thick dots—while the "empty" zones, i.e. the zones where the top layer "Si top" as well as the insulator layer made of $SiO_2$ were etched, removed, are shown in plain grey). It will be appreciated that other shapes can be considered, for example serpentine shapes, with meanders to further gain in compactness. However, desirably, the electric track PE that forms the inductance does not comprise portions extending facing one another while being separated by a distance less than 5 times, or even 10 times the width of the electric track PE. In other words, this electric track does not comprise portions that extend facing one another and which are close to one another (so as to prevent creating parasitic capacitances), except at the electrodes of the capacitor C in question, more generally at the mechanical oscillator (in other words, the portions of the electric track PE forming the electrodes EC1, EC2 of the capacitor C are not concerned by the constraint in question).

In an embodiment, the superconductive material is chosen from titanium nitride (TiN), niobium nitride (NbN) or a granular superconductive material. Titanium nitride is particularly beneficial because it makes it possible to obtain very thin layers (for example 10 nm thick) while still remaining homogeneous (with typical variations of a thickness of less than 1 nm). In practice, homogeneous layers of TiN, having a thickness less than or equal to 5 nm, and even less than or equal to 3 nm can be obtained. By way of example, for a layer made of TiN, a thickness comprised between 5 and 10 nanometres corresponds to a good compromise between ease of manufacturing (and low risk of manufacture failure) on the one hand, and obtaining a high kinetic inductance on the other hand. In addition to guaranteeing a high kinetic inductance, carrying out the track in question from such a thin layer makes it possible to ensure good mechanical properties for the oscillator. Indeed, the mass added by the electrode at the microbeam is reduced to the strict minimum, which in particular makes it possible to obtain relatively high mechanical resonance frequencies and therefore to ease the constraints to be complied with to be in the so called resolved-band conditions (well known in the field, these conditions will not be presented here). Moreover, obtaining lighter microbeams makes it possible to more easily cool the mechanical oscillator in such a way as to bring it to a quantum regime, a regime required when the device is used to carry out a transfer of a quantum variable from a microwave electrical system to a mechanical system (or even to an optical system). In addition, by reducing to the minimum the quantity of metal added on the microbeam, the mechanical losses and other dissipative effects that can occur in the metal, during the deformation thereof (displacement of defects for example) are also reduced. Measurements taken on such a device, with a track made from 20 nm thick TiN show that a kinetic inductance of 20 pH/square or more is then obtained. And for a track made of TiN, respectively 5 and 3 nm thick, a kinetic inductance of 100, and respectively 230 pH/square is obtained.

In an embodiment, the thickness of the electric track is less than or equal to 20 nm, even less than or equal to 10 nm and even less than or equal to 5 nm. In an embodiment, the thickness of the electric track is less than or equal to the London's length of the superconductive material. In an embodiment, the length of the electric track PE is less than or equal to 0.5 mm. Regarding its width, it can for example be comprised between 50 and 500 nm, even between 100 and 300 nm (it can be noted in this respect that the width of the track is not necessarily constant all along the track).

In an embodiment, the electric track PE has a kinetic inductance ten times greater than its magnetic inductance.

In an embodiment, the electric track PE has a parasitic capacitance less than twice the capacitance of the capacitor C and/or less than 2 femtofarad. The electric track in question can in particular have a total inductance (magnetic+kinetic) greater than 50 nanohenry, even greater than 100 nanohenry, while still having a parasite capacitance as low as what has just been specified.

Geometry of the Mechanical Oscillator.

The mechanical oscillator OM can have highly diverse geometries. In the embodiment shown in FIG. 4, the latter comprises a microbeam MP whereon is formed the first electrode EC1 of the capacitor. The second electrode EC2 located facing the microbeam MP (and therefore facing the first electrode EC1) is formed on a structure that is much larger in such a way that the oscillations of the mechanical oscillator OM (oscillations that cause a variation in the distance between electrodes) are mainly due to the vibration of the microbeam MP whereon is formed the first electrode EC1. In other terms, the first electrode EC1 is mobile while the second electrode is substantially fixed, or at least mobile at frequencies very different from the frequency of the vibration mode considered for the microbeam MP. However, the oscillator can also have other geometries wherein the structures on which are formed the first electrode EC1 and the second electrode EC2 are both able to oscillate (first and second mobile electrodes).

It is considered here that the vibration mode of the mechanical oscillator mentioned hereinabove, for which the microbeam mainly vibrates in the plane of the membrane (and for which $\omega_{\mu w}-\omega_{p1}=\omega_{opt}-\omega_{p2}=\omega_m$) has a frequency $\omega_m$ (resonant frequency) that is distinct from the other vibration modes of the mechanical oscillator. By way of example, for these other vibration modes, the difference between the oscillation frequency of the mode in question and the frequency $\omega_m$ can be greater than 5 times the full width at half-maximum of the resonance peak at $\omega_m$. However, alternatively, the respective resonance peaks of different vibration modes of the oscillator could be superimposed on one another.

Figure 5A:
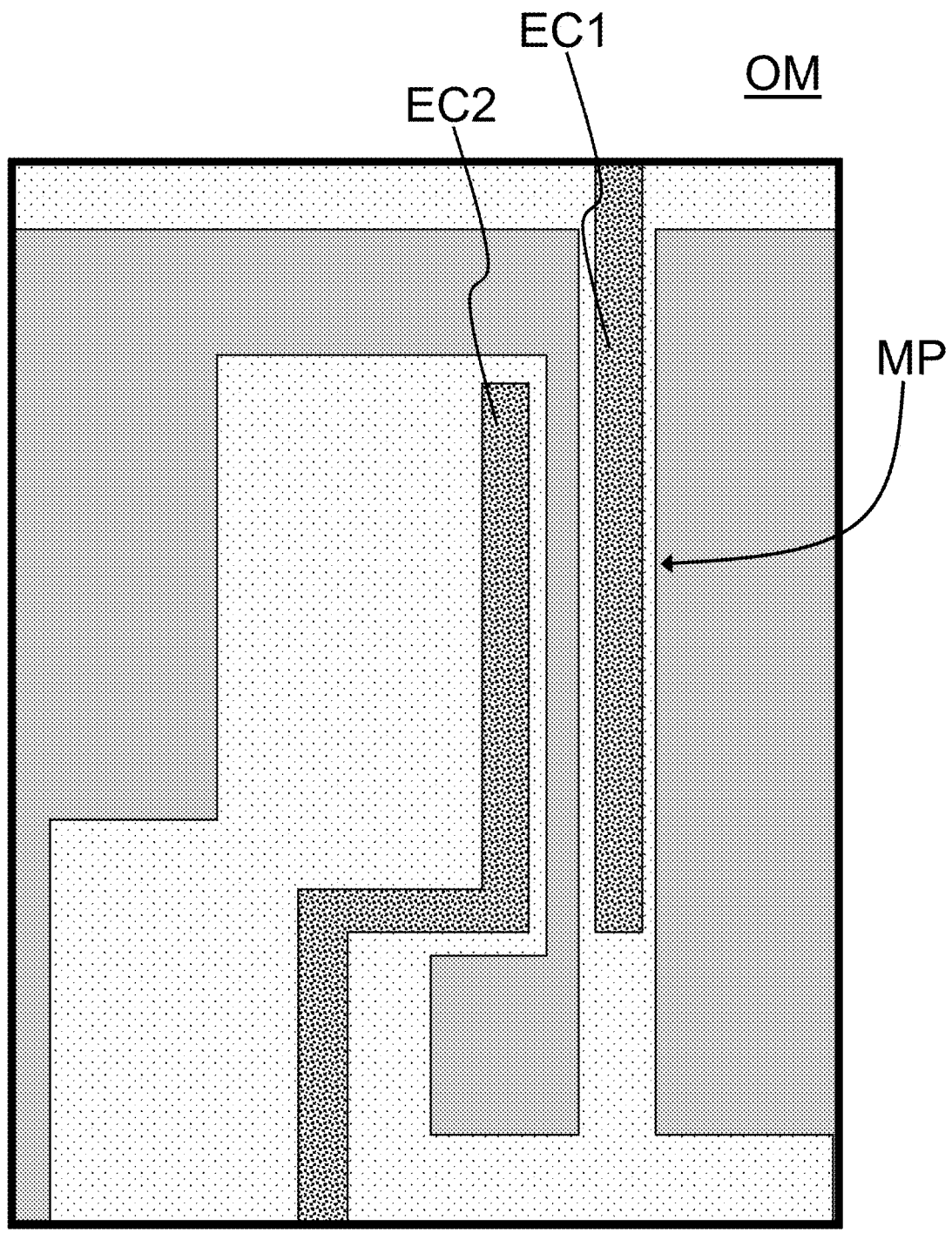
FIG. 5A shows a schematic representation of an oscillator according to a particular embodiment of the invention, seen from above.

In an embodiment shown in FIG. 5A, the microbeam MP of the mechanical oscillator OM is fixed at its two ends instead of having a free end (doubly clamped microbeam), with the rest of the structure being identical to that shown in FIG. 4. FIG. 5A shows the first electrode EC1 with a width less than that of the microbeam MP that supports the electrode, for the clarity of the figure, in order to be able to view the microbeam MP under the electrode EC1. But in practice, the first electrode EC1 generally occupies the entire width of the microbeam (as is shown in FIG. 5B).

Figure 5B:
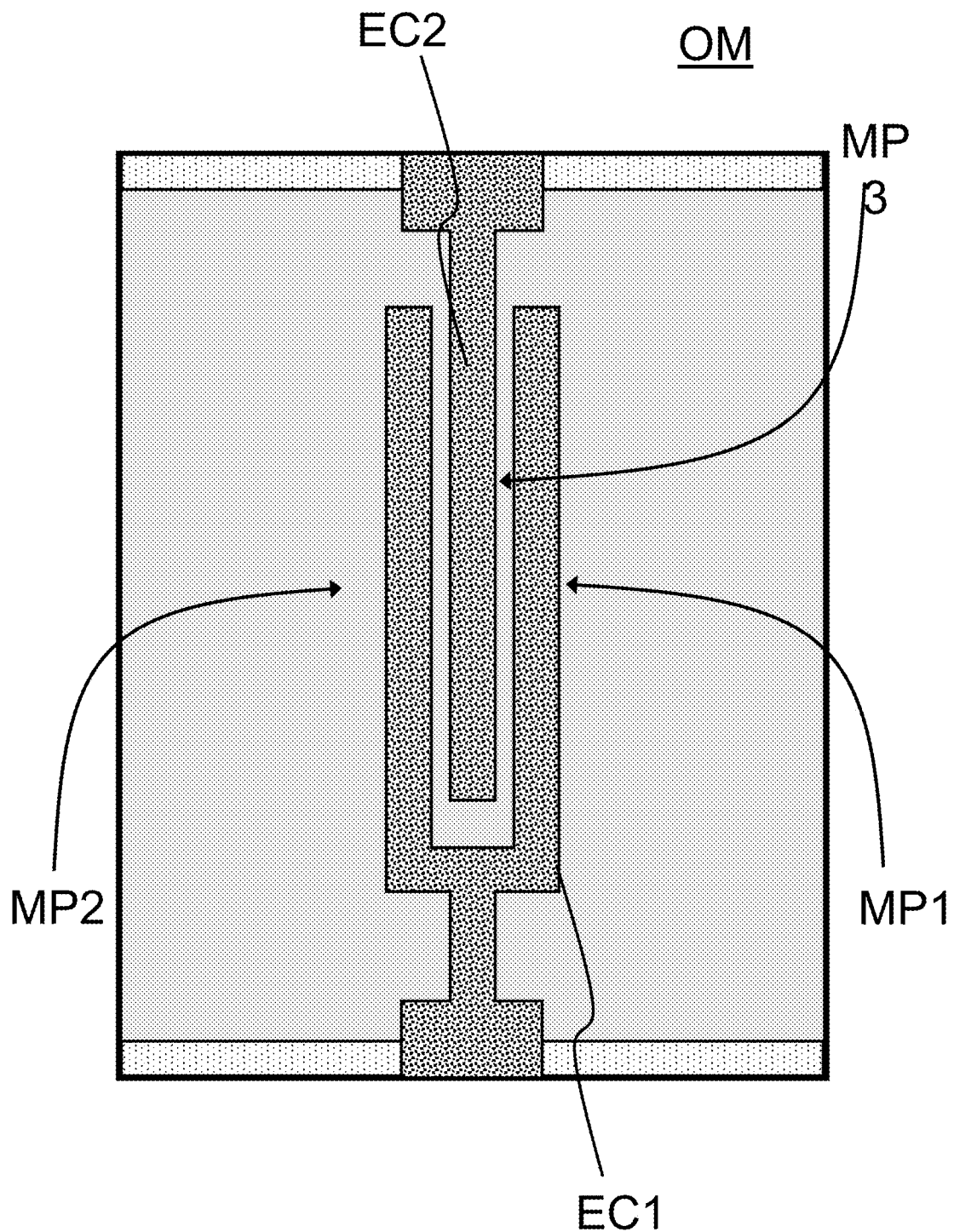
FIG. 5B shows a schematic representation of an oscillator according to another particular embodiment of the invention, seen from above.

In an another embodiment shown in FIG. 5B, the mechanical oscillator OM comprises a diapason composed of two microbeams MP1, MP2 connected together at one of their bases, as well as a microbeam MP3 located between the two microbeams of the diapason. In this geometry, the first electrode EC1 of the capacitor is formed on the two microbeams MP1, MP2 of the diapason while the second electrode EC2 is formed on the microbeam MP3 that extends between the two branches of the diapason. It can be noted that, in FIG. 5B (which is a top view), the microbeams MP1, MP2, MP3 are not directly visible themselves, as they are entirely covered by the electrodes (represented by a thick dots). Besides, in FIGS. 5B, 5C and 5D, the zones made of a superconductive material (with thick dots) are all carried out over a portion of the membrane (here made of silicon, represented by the area with thin dots), for example the microbeam in question, although the portion of the membrane in question is not visible in the figure (as it is covered by the material in question).

Figure 5C:
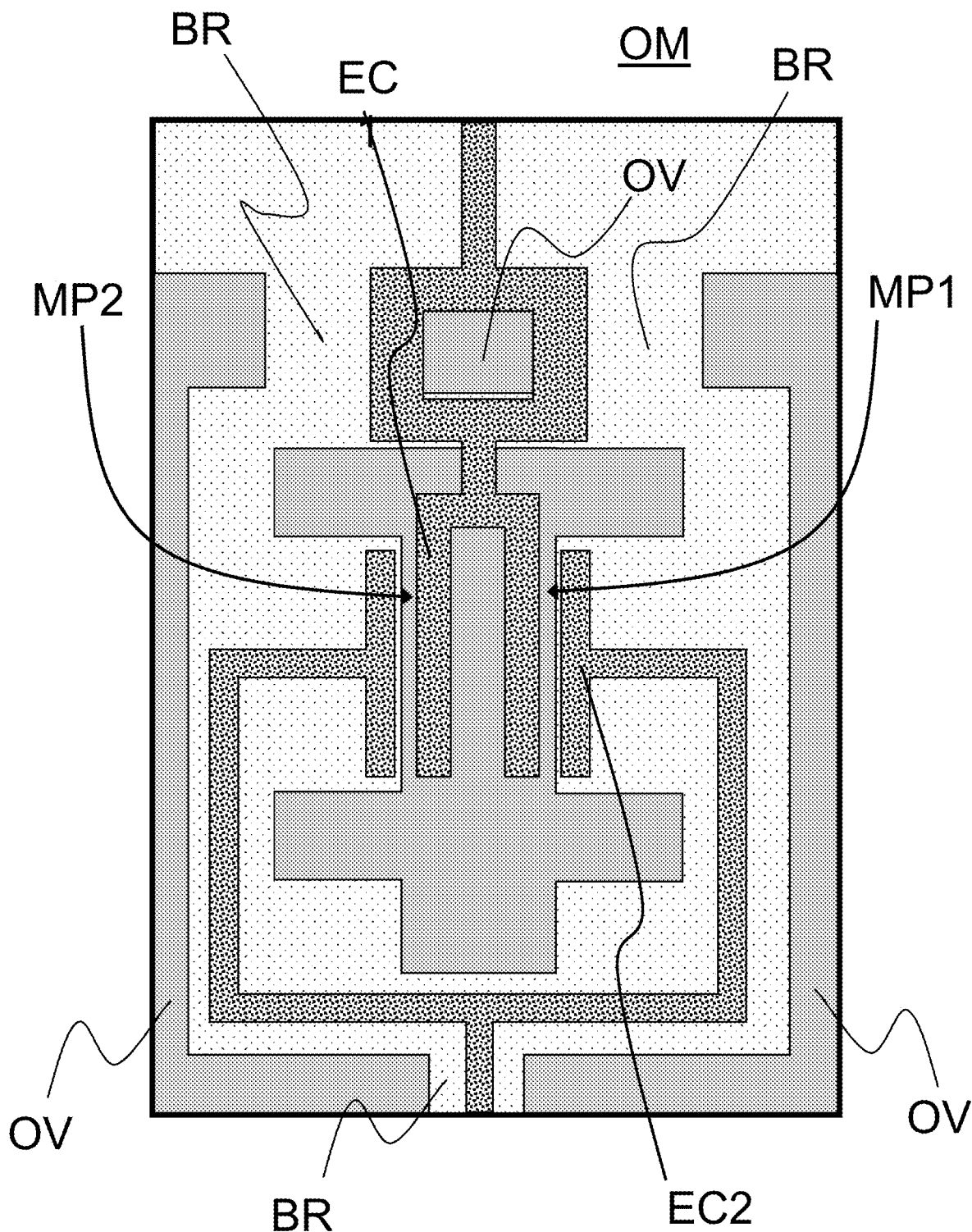
FIG. 5C shows a schematic representation of an oscillator according to yet another particular embodiment of the invention, seen from above.

In another embodiment shown in FIG. 5C, the mechanical oscillator OM comprises a diapason composed of two microbeams MP1, MP2 connected together at one of their bases. In this geometry, the first electrode EC1 of the capacitor is formed on the two microbeams and the second electrode EC2 comprises two track portions, formed on either side of the diapason (outside the diapason). The diapason is connected to a frame, whereon the second electrode EC2 is formed, and which is separated from a main portion of the membrane by openings OV made in this membrane. This frame, which forms a sort of island, is connected to this main portion of the membrane only by bridges BR, here in the number of three. Here, these bridges, each formed by a portion of the membrane, each have a width less than 10 times, or even five times the width of the microbeam MP1 (which is for example a width of 1 micron while the microbeam MP1 has a width of 0.2 micron). Isolating this frame as such from the rest of the membrane makes it possible to insulate the mechanical oscillator from external vibration modes, which are parasitic.

The embodiments of FIG. 5B and FIG. 5C, with an oscillator in the form of a diapason, make it possible to obtain more balanced resonant modes than with a single microbeam: the quality factor is higher because the coupling with the external vibration modes is smaller. In an alternative of the embodiment of FIG. 5C, the two microbeams MP1, MP2 that carry the first electrode could be connected to one another at their two ends, thus forming a rectangle of which the two long sides are formed by the two microbeams MP1 and MP2 (each microbeam then being fixed at its two ends).

Figure 5D:
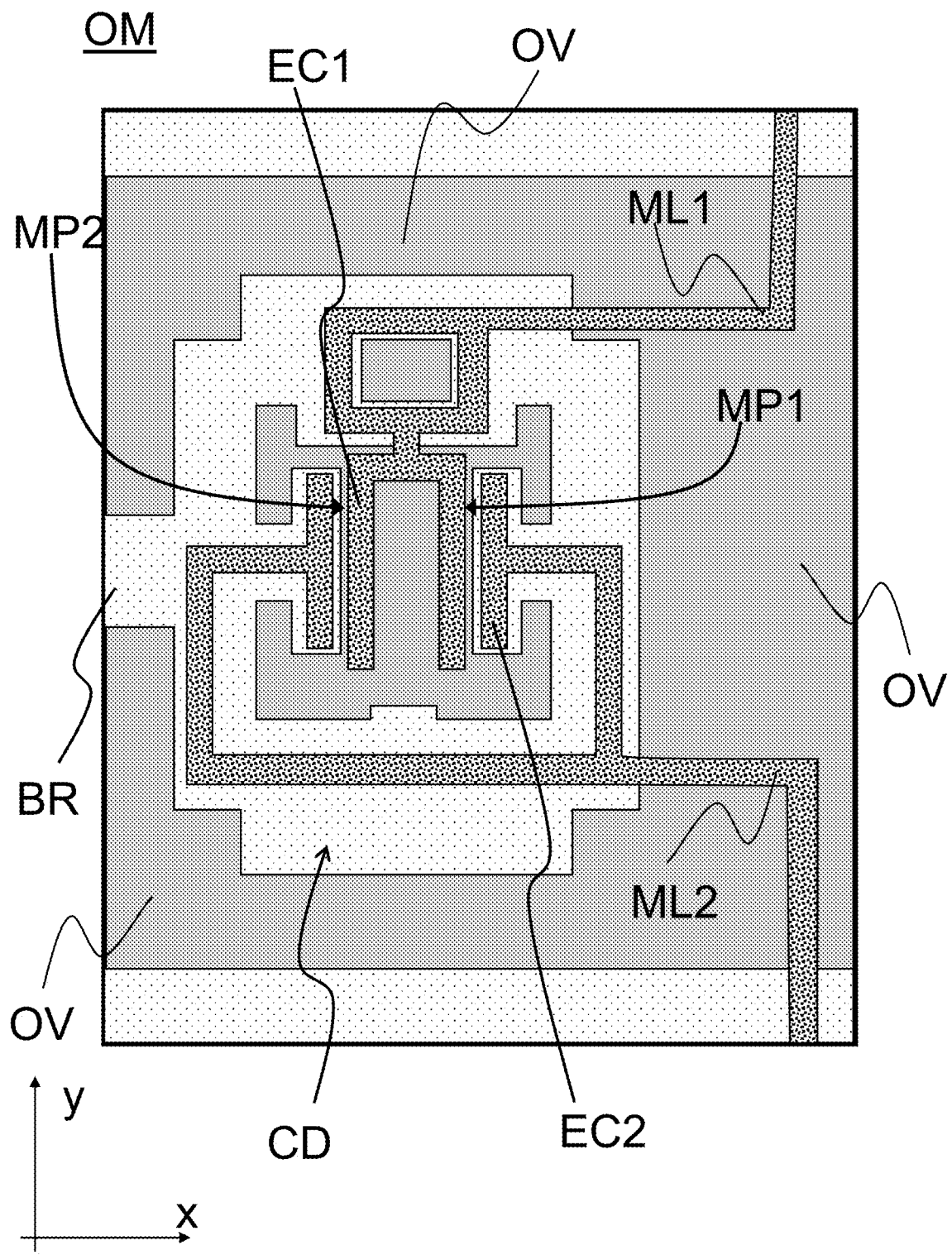
FIG. 5D shows a schematic representation of an oscillator according to yet another particular embodiment of the invention, seen from above.

In another embodiment shown in FIG. 5D, as in the preceding embodiment, the mechanical oscillator OM comprises a diapason comprised of two microbeams MP1, MP2 connected together at one of their bases. This embodiment is similar to the embodiment of FIG. 5C, but instead of being connected to the main portion of the membrane by three bridges, the frame CD, that supports the second electrode EC2 and to which the diapason is connected, is connected to the main portion of the membrane by a bridge BR and by two connector microbeams ML1, ML2. The bridge has a rectangular shape and a width higher than five times, or even ten times the width of the microbeam MP1. The connector microbeams ML1 and ML2 have a general elongated and bent shape: each connector microbeam comprises two portions each longer than wide (and not necessarily straight; they have for example a width comprised between 1 time and 2 times the width of the microbeam MP1) and which are connected to one another by making a bend. Thus, they form an angle between them, here a 90° angle. This configuration prevents, as much as possible, the transfers of constraints between the main portion of the membrane on one hand, and the island (the frame) which is used as a support for the mechanical oscillator OM on the other hand. This mechanical insulation makes it possible to reduce different disturbances that could come from the external environment, for example a change in mechanical resonant frequency caused by a general deformation of the substrate or of the membrane, in particular for the double embedded beams. In the example of FIG. 5D, for each connector microbeam ML1, ML2, the two portions of the microbeam extend respectively parallel to an axis x, and parallel to an axis y. The connector microbeam thus has a stiffness that is much lower than that of the frame CD, in both the direction x, and in the direction y, allowing for the mechanical insulation in question. This embodiment makes it possible moreover to further increase the insulation of the mechanical oscillator relatively to the external vibration modes.

Figure 6:
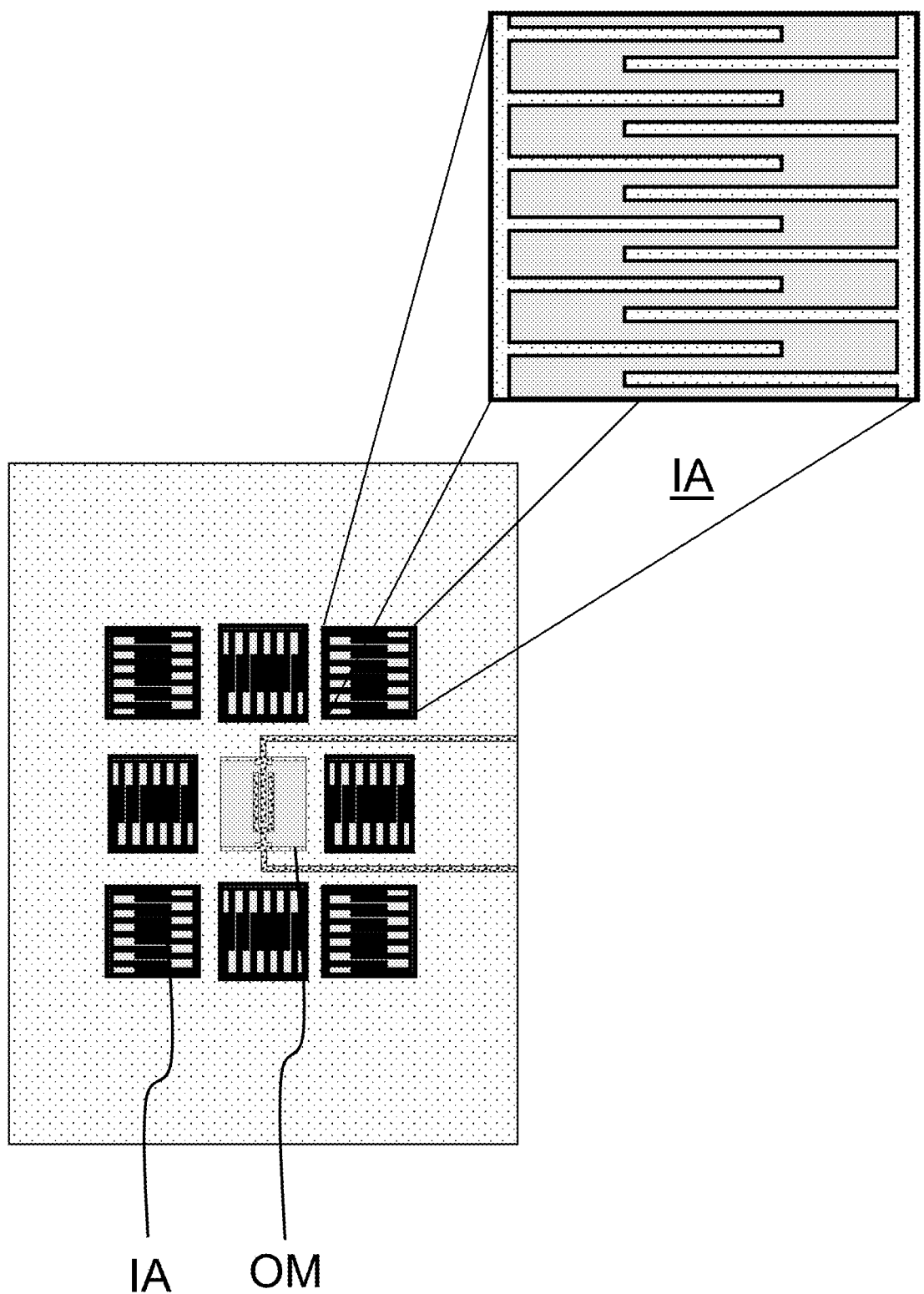
FIG. 6 shows a device according to the invention wherein the mechanical oscillator is surrounded by acoustic insulators, seen from above.

In an embodiment shown in FIG. 6, the mechanical oscillator is at least partially surrounded by a plurality of acoustic insulators IA. Here, the mechanical oscillator is surrounded by acoustic insulators over its entire periphery. Each insulator is formed in the membrane in question (i.e. in the silicon top portion, "Si top" of the SOI is substrate), by etching. It comprises several microbeams parallel to one another. The microbeams have a vibration frequency or frequencies (natural, resonant frequencies) in the same range and the vibration frequency $\omega_m$ of the mechanical oscillator (comprised for example between 0.5 and 100 MHz). The direction of the microbeams varies from one insulator to another. Here, two adjacent isolators have more precisely beams oriented at 90 degrees from one another. Such as shown in FIG. 6, the device comprises a single band of insulators surrounding the mechanical oscillator (band that comprises 8 insulators). Thus, for this example, in each direction of the plane, the mechanical oscillator OM is separated from the rest of the membrane by an acoustic insulator, but not by two. Alternatively, the device could however comprise two, or more than two, bands of insulators, a first band surrounding the mechanical oscillator while a second band surrounds the oscillator as well as the first band, and so on. In this case, it is also possible to provide a variation in the direction of the microbeams of the insulators, from one insulator to another (i.e.: between two adjacent insulators).

Substrate Supporting the Membrane

In an embodiment, the device is carried out at least partially on a substrate of the SOI type. In an embodiment, this SOI substrate is of the "trap-rich" type. Such a substrate comprises a layer charged with many crystallographic defects located between the buried oxide layer (or BOX—well known to those skilled in the art) and the HR-Si substrate (called high-resistivity substrate). In general, this layer rich in defects is made of polycrystalline silicon (polySi) or of amorphous silicon (a-Si). In the absence of such a layer rich in defects, the fixed charges present in the buried oxide layer attract the charges present in the substrate at the interface creating a thin conduction layer that reduces the effective resistivity of the substrate and causes losses (dissipation effects) for an electrical circuit made on the top silicon layer, in particular in the microwave frequency range. The crystalline defects introduced trap these charges and allow the HR-Si substrate to act as a lossless dielectric substrate, which improves the quality factor of the resonant electrical circuit.

In an embodiment, the membrane is at least partially suspended. For this, as shown in FIG. 4, orifices OR can be arranged in the membrane so as to carry out an etching (a removal) of the layer supporting the membrane, for example with an etching with hydrofluoric acid HF (chemical etching).

EXAMPLE

In an embodiment, the microbeam is made from silicon and has a length of 14 µm, a thickness of 0.1 µm (according to a direction perpendicular to the substrate), a width of 0.2 µm and a density of 2,330 kg/m$^3$. From the bending vibration mode 0 (bending while remaining in a plane parallel to the substrate, and with the two ends clamped), it is possible to determine that the effective mass is $6.524e^{-16}$ kg, that the frequency associated with this mode $\omega_m$ is $2\pi \times 9.17$ MHz and that the amplitude of quantum fluctuation is 37 fm (these values correspond to a microbeam without the first electrode; with the first electrode, made of TiN and of a thickness of 5 nm, values approximately 10% different are obtained). These different pieces of information make it possible to deduce that, with a device according to the invention, it is possible to obtain an electromagnetic coupling function an order of magnitude greater than what is obtained in the device of the state of the art (of G. Arnold et al.) presented in the introduction. In particular, as the parasitic capacitance of the inductance is lower than in the prior art, an efficiency it close to 1 is expected, or in the very least comprised between 0.25 and 0.9.

Method of Manufacturing

In order to obtain a mechanical oscillator such as presented hereinabove, it is possible to use a substrate of the SOI type comprising a layer of silicon on a layer of silicon oxide. A second aspect of the invention shown in FIG. 7A to FIG. 7E relates to a method for manufacturing a mechanical oscillator OM, intended for an electromechanical conversion device DI.

Figure 7A:
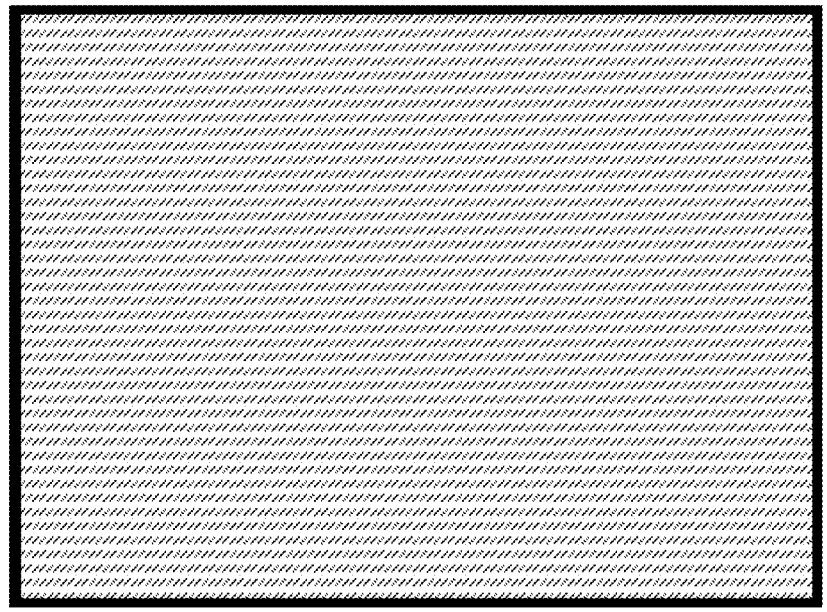
FIG. 7A to FIG. 7E schematically shows as a top view the oscillator of FIG. 4 at different steps of a method for manufacturing according to the invention.
Figure 7A:
Figure 7B:
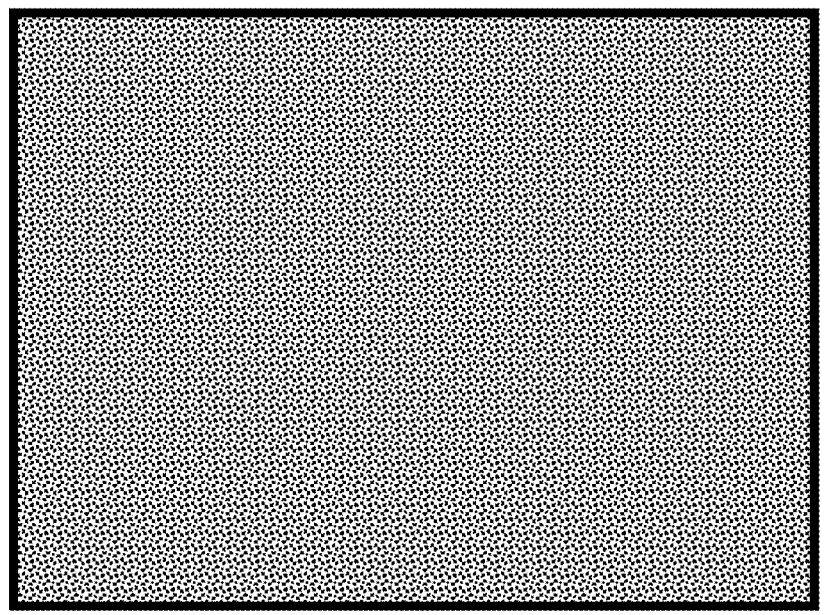
Figure 7B:

From this SOI substrate (shown in FIG. 7A as a top view), the method according to the invention comprises a step of full-plate deposition of a layer of superconductive material intended to form the electric track. The thickness of the material deposited during this step is chosen in such a way as to obtain, at the end of the method, an electric track with high kinetic inductance. At the end of this step, as shown in FIG. 7B, the substrate is entirely covered by the layer of superconductive material (TiN in this example).

The method then comprises a first step of lithography in such a way as to obtain a pattern defining a membrane in the silicon layer. The pattern thus makes it possible to define the contours of the membrane on which the conversion device will be carried out, in particular the microbeam or microbeams MP, MP1, MP2, MP3, as well as openings OR in this membrane in such a way as to facilitate the release thereof during later etching (i.e. during the removal of a portion of the silicon oxide layer).

Figure 7C:
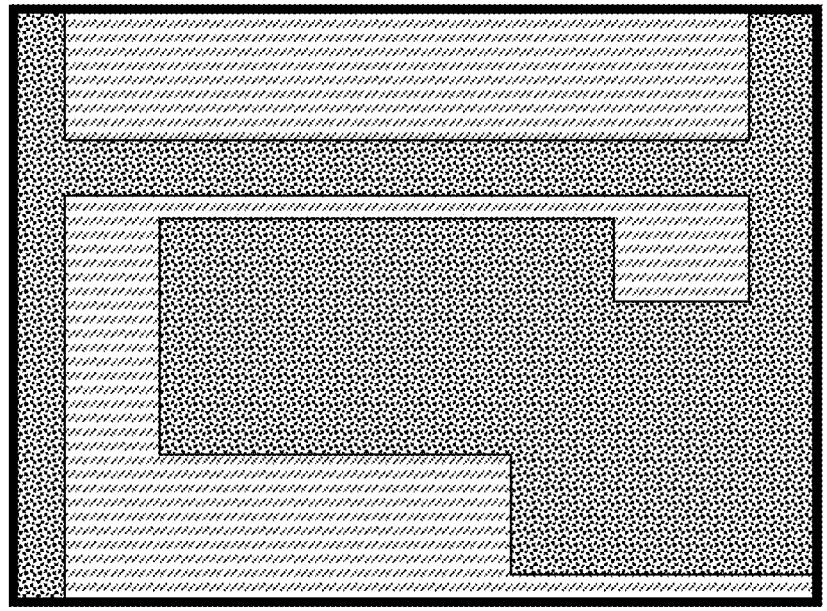
Figure 7C:
Figure 7C:

The method then comprises a first step of etching the layer of superconductive material and the layer of silicon according to the pattern defined during the first step of lithography. In other words, the patterns defined during the first step of lithography are imprinted in the layer of superconductive material and in the layer of silicon. At the end of this step, as shown in FIG. 7C, the contours of the membrane (and therefore of the microbeam or microbeams) are defined in the layer of silicon and in the layer of superconductive material. It is interesting to note that the separation between the future first and second electrodes is carried out during this step. In other words, it is possible to define a very low spacing without however imposing excessively strong alignment constraints during the carrying out of the electric track (moderated alignment constraint for the mask used for the etching of the rest of the track, not yet etched at this stage; in particular, a very precise alignment of this mask with the microbeam or microbeams already etched is not indispensable, since the portion of track located on the microbeams is etched as the same time as the microbeams). This manufacturing ingenuity facilitates the cointegration of an inductance made of superconductive material (whose overall dimensions are substantial) and of a micromechanical oscillator (of clearly smaller dimensions). Note moreover that the use of TiN for the track is conducive to this cointegration, because it resists well the hydrofluoric acid used to release the suspended membrane.

Figure 7D:
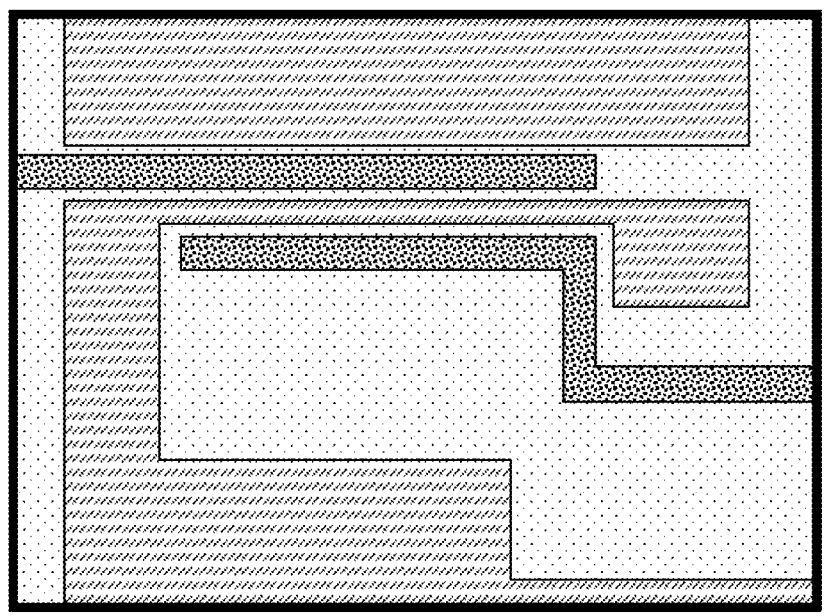
Figure 7D:
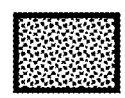
Figure 7D:
Figure 7D:
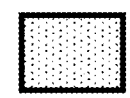

The method then comprises a second step of lithography in such a way as to obtain a pattern defining an electric track followed by a second step of etching of the layer of superconductive material according to the pattern defined during the second step of lithography in such a way as to obtain the electric track. The electric track PE, formed on the layer of silicon, is achieved during this second step of etching, as shown in FIG. 7D.

Figure 7E:
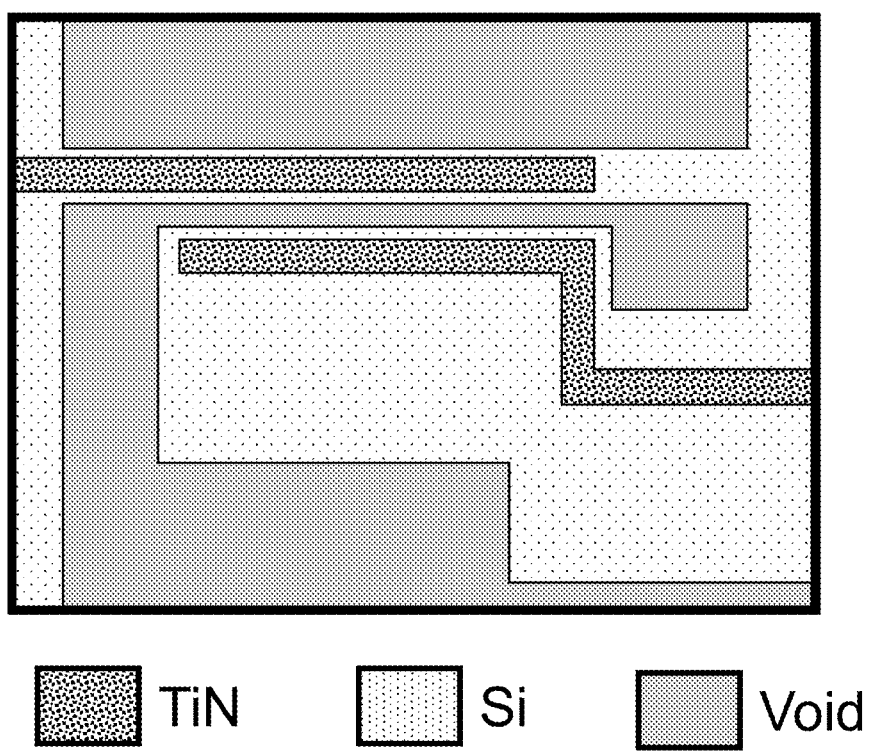

Finally, so as to release the silicon membrane, the method according to the invention comprises a third step of etching in the silicon oxide layer. At the end of this step, as shown in FIG. 7E, the silicon membrane is released, i.e. a portion of the membrane is suspended, thanks to this removal of a portion of the silicon oxide layer.

Systems Using an Electromechanical Conversion Device According to the Invention

A third aspect of the invention relates to a quantum system comprising a conversion device DI according to the first aspect of the invention and an optical resonator, with an opto-mechanical coupling between the optical resonator and the mechanical oscillator of the conversion device DI. In particular, the optical frequency electric field confined in the optical resonator (for example the amplitude, or the phase of this field) is coupled to the oscillations of the mechanical oscillator.

A fourth aspect of the invention relates to a quantum system comprising a conversion device DI according to the first aspect of the invention and a qubit, the qubit being coupled to the conversion device DI. In an embodiment, the qubit is a superconducting qubit and the latter is coupled to the device DI according to the invention by means of a superconducting electric line. In an embodiment, the qubit is a qubit based on an NV centre (well known in the field) present in a diamond crystal of small size solidly attached to the microbeam MP of the mechanical oscillator OM of the conversion device (a magnetic field being further applied at the NV centre in question).

Figure 1:
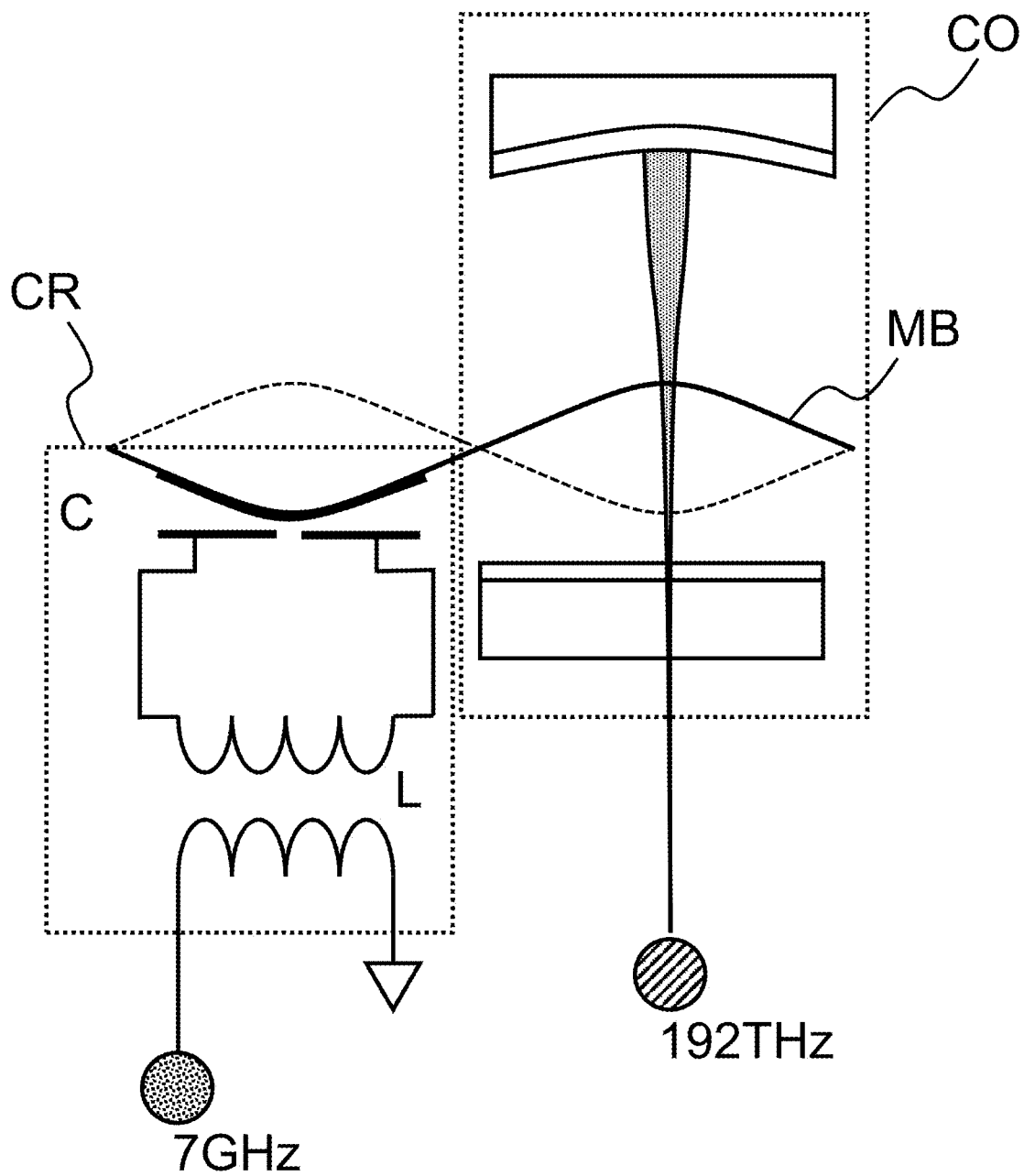
FIG. 1 shows a schematic representation of a conversion device.
Figure 2:
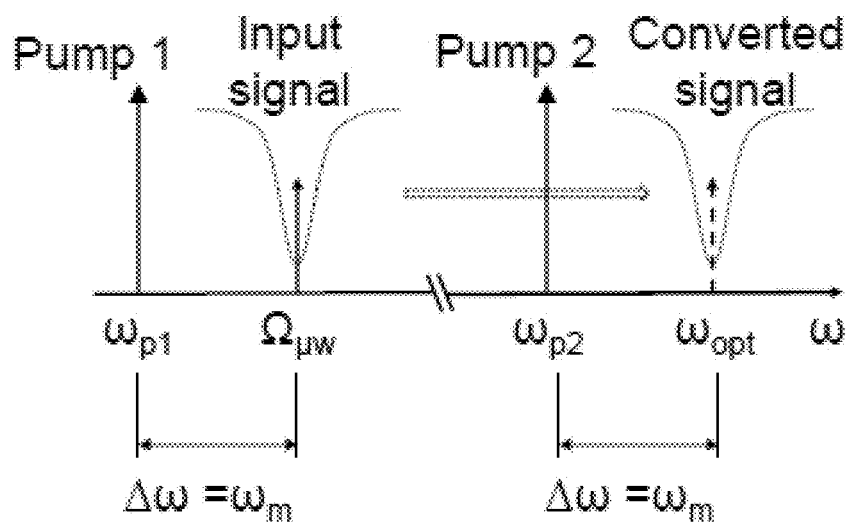
FIG. 2 shows a schematic representation of the operating principle of the conversion.
Figure 3:
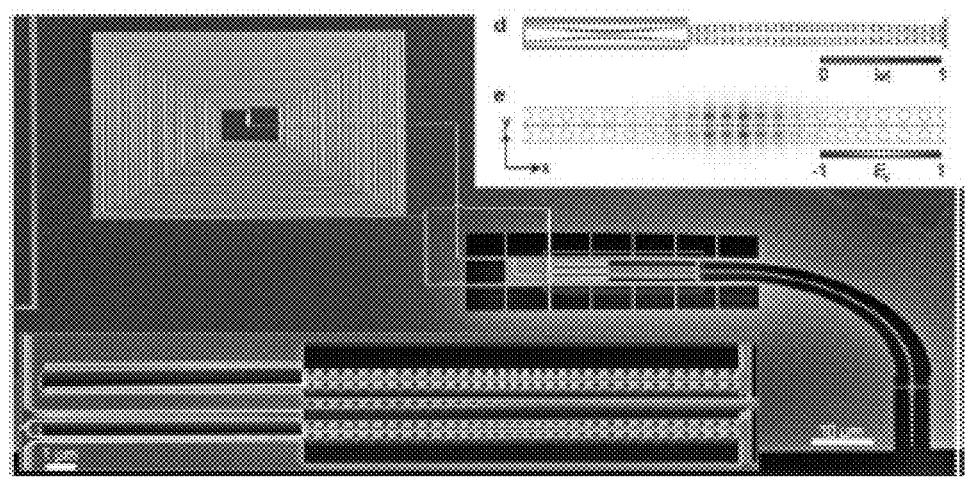
FIG. 3 shows a conversion device according to the prior art.

The means of coupling an optical oscillator or a qubit to a mechanical oscillator in general (also applicable to the oscillator of the device according to the invention) will not be detailed here by a concern for concision. However, such means are for example described in the document by G. Arnold et al. mentioned in the introduction to the present text, and shown in FIG. 3.

The invention claimed is:

1. An electromechanical conversion device comprising: a resonant electrical circuit comprising an inductance and a capacitor, the capacitor having at least a first electrode and a second electrode; and a mechanical oscillator comprising at least one microbeam formed in a membrane, the first and second electrodes being located side by side and the first electrode of the capacitor being located on a face of the microbeam so that an electrical capacitance of the capacitor varies when the mechanical oscillator oscillates, wherein the inductance comprises an electric track of very low thickness made on the membrane and made of a superconductive material chosen so as to obtain an electric track having a high kinetic inductance, three times greater than its magnetic inductance.

2. The electromechanical conversion device according to claim 1, wherein the electric track has a kinetic inductance per square greater than or equal to 20 picohenry per square.

3. The device according to claim 2, wherein the electric track has a kinetic inductance per square greater than or equal to 50 picohenry per square.

4. The electromechanical conversion device according to claim 1, wherein the superconductive material of the electric track is chosen from titanium nitride (TiN), niobium nitride (NbN) or a granular superconductive material.

5. The electromechanical conversion device according to claim 1, wherein the thickness of the electric track is less than or equal to 20 nm.

6. The electromechanical conversion device according to claim 1, wherein the thickness of the electric track is less than or equal to the London's length of the superconductive material.

7. The electromechanical conversion device according to claim 1, wherein, over most of its length, the electric track does not comprise portions extending facing one another while being separated by a distance less than 10 times the width of the electric track.

8. The electromechanical conversion device according to claim 1, wherein the microbeam of the mechanical oscillator is a first microbeam and wherein the mechanical oscillator comprises a second microbeam and a third microbeam, the first and the second microbeam being connected to one another so as to form a diapason, the third microbeam being located between the first and second microbeams of the diapason, the second electrode of the capacitor being formed on the third microbeam.

9. The electromechanical conversion device according to claim 1, wherein at least a portion of the electric track is formed on a silicon-on-insulator substrate of trap-rich type.

10. The electromechanical conversion device according to claim 1, wherein at least a portion of the electric track (PE) is located on a portion of the membrane that is suspended.

11. The electromechanical conversion device according to claim 1, wherein the mechanical oscillator comprises a frame separated from a main portion of the membrane by openings made in the membrane, the microbeam being connected to the frame and the second electrode being carried out on the frame or on another microbeam that is connected to the frame, the frame connecting to the main portion of the membrane by a bridge and by one or more connector microbeams, each connector microbeam comprising two portions each longer than wide and which are connected to one another by making a bend.

12. The electromechanical conversion device according to claim 1, wherein the mechanical oscillator is surrounded by acoustic insulators formed in said membrane, each insulator comprising several microbeams parallel to one another, with a direction of the microbeams varying from one insulator to the other.

13. A method for manufacturing an electromechanical conversion device, including a resonant electrical circuit comprising an inductance and a capacitor, the capacitor having at least a first electrode and a second electrode; and a mechanical oscillator comprising at least one microbeam formed in a membrane, the first and second electrodes being located side by side and the first electrode of the capacitor being located on a face of the microbeam so that an electrical capacitance of the capacitor varies when the mechanical oscillator oscillates, wherein the inductance comprises an electric track of very low thickness made on the membrane and made of a superconductive material chosen so as to obtain an electric track having a high kinetic inductance, three times greater than its magnetic inductance, the method comprising, from a substrate comprising a silicon oxide layer and a silicon layer on the silicon oxide layer:

a step of full-plate deposition of a layer of superconductive material intended to form the electric track; then a first step of lithography so as to obtain a pattern defining the membrane in the silicon layer, the pattern defining at least said at least one microbeam of the mechanical oscillator;

a first step of etching the layer of superconductive material and of the layer of silicon according to the pattern defined during the first step of lithography; then a second step of lithography so as to obtain a pattern defining the electric track;

a second step of etching the layer of superconductive material according to the pattern defined during the second step of lithography so as to obtain the electric track;

a third step of etching in the silicon oxide layer so as to release the silicon membrane defined hereinabove.

14. A quantum system comprising an electromechanical conversion device and an optical resonator, said electromechanical conversion device including a resonant electrical circuit comprising an inductance and a capacitor, the capacitor having at least a first electrode and a second electrode; and a mechanical oscillator comprising at least one microbeam formed in a membrane, the first and second electrodes being located side by side and the first electrode of the capacitor being located on a face of the microbeam so that an electrical capacitance of the capacitor varies when the mechanical oscillator oscillates, wherein the inductance comprises an electric track of very low thickness made on the membrane and made of a superconductive material chosen so as to obtain an electric track having a high kinetic inductance, three times greater than its magnetic inductance, and said optical resonator being coupled to the mechanical oscillator of the conversion device.

15. A quantum system comprising an electromechanical conversion device and a qubit, said electromechanical conversion device including a resonant electrical circuit comprising an inductance and a capacitor, the capacitor having at least a first electrode and a second electrode; and a mechanical oscillator comprising at least one microbeam formed in a membrane, the first and second electrodes being located side by side and the first electrode of the capacitor being located on a face of the microbeam so that an electrical capacitance of the capacitor varies when the mechanical oscillator oscillates, wherein the inductance comprises an electric track of very low thickness made on the membrane and made of a superconductive material chosen so as to obtain an electric track having a high kinetic inductance, three times greater than its magnetic inductance, and said qubit being coupled to the conversion device.

* * * * *